(12) United States Patent
Huitsing

(10) Patent No.: US 7,265,574 B2
(45) Date of Patent: Sep. 4, 2007

(54) FAIL-SAFE METHOD AND CIRCUIT

(75) Inventor: Albert Jan Huitsing, Nijmegen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 10/531,398

(22) PCT Filed: Sep. 19, 2003

(86) PCT No.: PCT/IB03/04216

§ 371 (c)(1),
(2), (4) Date: Apr. 14, 2005

(87) PCT Pub. No.: WO2004/036748

PCT Pub. Date: Apr. 29, 2004

(65) Prior Publication Data

US 2005/0285632 A1 Dec. 29, 2005

(30) Foreign Application Priority Data

Oct. 21, 2002 (EP) .................................. 02079358

(51) Int. Cl.
*H03K 19/007* (2006.01)
(52) U.S. Cl. ............................. 326/14; 326/9; 326/112; 326/121; 326/122
(58) Field of Classification Search .................... 326/9, 326/14, 112, 121–122
See application file for complete search history.

(56) References Cited

U.S. PATENT DOCUMENTS 4,709,172 A * 11/1987 Williams .................... 327/437
4,918,336 A * 4/1990 Graham et al. ............. 326/117
6,288,577 B1 * 9/2001 Wong .......................... 327/65
6,320,406 B1 * 11/2001 Morgan et al. ............... 326/14

OTHER PUBLICATIONS

Knight Jr, Thomas F, "A Self-Terminating Low-Voltage Swing CMOS Output Driver", Apr. 1988 IEEE Journal Solid State Circuits, vol. 23, No. 2 pp. 457-464.*

* cited by examiner

*Primary Examiner*—Rexford Barnie
*Assistant Examiner*—Jason Crawford
(74) *Attorney, Agent, or Firm*—Peter Zawilski

(57) ABSTRACT

A method and a circuit for producing a fail-safe output signal in case of an open circuit condition of an input pad of a digital circuit unit, comprising a first inverter stage providing a constant switch level; a second inverter stage providing a variable switch level that depends of the signal level of the input pad and comparing the constant switch level of the first inverter stage with the variable switch level of the second stage and providing an output signal at an output terminal thereof if the variable switch level of the second stage is greater than the constant switch level; and an additional circuit clement connected in series with the second inverter for decreasing the switch level of the second inverter stage.

11 Claims, 5 Drawing Sheets

FAIL-SAFE METHOD AND CIRCUIT

CONTINUATION DATA

This patent document is a national stage filing under 35 U.S.C. § 371 of International Application No. PCT/IB03/04216 filed on Sep. 19, 2003, which claims foreign priority under 35 U.S.C. § 119 to EP Application No. 02079358.4 filed on Oct. 21, 2002.

The present invention relates to a fail-safe method and circuit for producing a fail-safe output signal in case of an open circuit condition of an input pad of a digital circuit unit.

An undesired behavior at the system level occurs in case of unconnected input pins. If these input pins were allowed to float, this would lead to undesired switching of the output due to thermal noise. To prevent thermal noise during switching, an open fail-safe mechanism is added. The open fail-safe mechanism is activated only if the input pins are not connected. The open fail-safe mechanism pulls an input terminal of a disconnected cable to a defined level when an open circuit (invalid signal level) is detected. The open fail-safe mechanism prevents undesired behavior at the system level in case of unconnected input pins. Several options are possible: comparators, diodes, MOSFETs or high threshold input stages.

The open fail-safe mechanism is used in low voltage differential signaling (LVDS) products. In LVDS small differential signals are used to transport data information. The applicable standard is TIA/EIA-644. The standard TIA/EIA-644 says that other standards and specifications using the electrical characteristics of a LVDS interface circuit may require that specific interchange circuits be made fail-safe to certain fault conditions. Such fault conditions may include one or more of the following, such as generator in power-off condition; receiver not connected to the generator; open-circuited interconnecting cable; short-circuited interconnecting cable; input signal to the load remaining within the transition region (±100 mV) for an abnormal period of time (application dependent). When detection of one or more of the above fault conditions is required by specified applications, additional provisions are required in the load and the following items must be determined and specified: which interchange circuits require fault detection; what faults must be detected; what action must be taken when a fault is detected; the binary state that the receiver assumes; what is done does not violate this standard. The method of detection of fault conditions is application-dependent and is therefore not further specified as it is beyond the scope of this standard.

U.S. Pat. No. 6,288,577 B1 discloses a fail-safe circuit for a differential receiver which can tolerate high common-mode voltages. An output from a differential amplifier that receives a V+ and a V− differential signal can be blocked by a NOR gate when the fail-safe condition is detected, such as when the V+, V− lines are open. Pull up resistors pull V+, V− to VCC when an open failure occurs. A pair of comparators receive a reference voltage on the non-inverting input. Once comparator outputs are high when the V+ line is above the reference voltage, and the other comparator outputs are high when the V− line is above the reference voltage. If both V+ and V− are above the reference voltage, the NOR gate blocks the output from the differential amplifier, providing a fail-safe output signal. Since the reference voltage is very close to VCC, a high common-mode bias can exist on V+, V− without falsely activating the fail-safe circuit.

U.S. Pat. No. 6,288,577 B1 uses a fail-safe circuit which pulls input lines to VCC in the case of open lines. Furthermore, it utilizes an analog comparator to compare one of the differential signals V+ and V− with a reference voltage that equals 97% of VCC. Furthermore, bipolar transistors may be required to get the required performance from the comparator.

U.S. Pat. No. 6,320,406 B1 discloses an active fail-safe method and apparatus for an LVDS receiver that uses a window comparator circuit to monitor the differential voltage at the receiver's input pins and drive the output to a known logic HIGH state in the absence of a valid input signal; i.e., when the input differential signal is less than a chosen threshold value of approximately 80 mV. Such a condition may occur when the cable is removed or damaged in such a way that no valid input signal is present. In the presence of a valid input signal, the circuit's output tracks the differential input without any degradation to the signal.

The U.S. Pat. No. 6,320,406 B1 describes an LVDS receiver that detects too small a differential voltage that blocks the input. By means of a pull resistor between the two differential inputs A and B both input voltages are drawn to each other in an open situation. The window comparator checks if this signal difference drops below 80 mV. The comparator is an analog circuit, it incorporates bipolar transistors and it requires at least one reference current source. A timer prevents direct influence of the open fail-safe on the output signal. If the timer would be omitted, the open fail-safe detection would be activated at every signal transition.

It is an object of the present invention to provide a fail-safe method and circuit for producing a fail-safe output signal in case of an open circuit condition of an input pad of a digital circuit unit.

To achieve the object of the present invention a method for producing a fail-safe output signal in case of an open circuit condition of an input pad of a digital circuit unit is disclosed comprising providing a constant switch level in a first inverter stage; providing a variable switch level in the second inverter stage that depends on the signal level of the input pad; comparing the constant switch level of the first inverter stage with the variable switch level of the second stage and providing an output signal at an output terminal thereof if the switch level of the second stage is greater than the constant switch level; and decreasing the switch level of the second inverter stage by an additional circuit element connected in series with the second inverter, a defined output being produced irrespective of the open circuit condition of an input pad.

To achieve the object of the present invention a fail-safe circuit for producing a fail-safe output signal in case of an open circuit condition of an input pad of a digital circuit unit is disclosed, comprising a first inverter stage providing a constant switch level; a second inverter stage providing a variable switch level that depends on the signal level of the input pad and comparing the constant switch level of the first inverter stage with the variable switch level of the second stage and providing an output signal at an output terminal thereof if the variable switch level of the second stage is greater than the constant switch level; and an additional circuit element connected in series with the second inverter for decreasing the switching level of the second inverter stage.

The advantageous features of the method and the circuit are that there is no need for current mirrors, bandgaps, or other analog parts. The present invention is simple to implement, because hardly any tuning is needed. It is easy to simulate and to match on a layout. The die area used is very small. The process dependency is reduced. Simulations showed that the switch level hardly varies with process parameter variation.

According to a preferred embodiment of the invention, the first inverter stage is a transistor stage, and the gate electrodes and drain electrodes of the transistors of the first inverter stage are connected to each other.

According to a preferred embodiment of the invention, the second inverter stage is a transistor stage, and the gate electrodes of the transistors of the second inverter stage are connected to each other and the drain electrodes of the transistors are connected to each other.

According to a preferred embodiment of the invention, the gate electrodes of the second inverter stage are connected to the gate electrodes of the first inverter stage.

According to a preferred embodiment of the invention, the input terminal is connected to a source electrode of the second inverter stage.

According to a preferred embodiment of the invention, the output terminal is connected to a drain electrode of the second inverter stage.

According to a preferred embodiment of the invention, the additional circuit element is a transistor in saturated mode.

According to a preferred embodiment of the invention, the additional circuit element is a transistor in saturated mode in which the gate of the transistor is connected to the VCC and the source is connected to ground while the defined signal is a high-level signal.

According to a preferred embodiment of the invention, the additional circuit element is a transistor in saturated mode in which the gate of the transistor is connected to ground and the source is connected to VCC while the defined signal is a low-level signal.

To achieve the object of the present invention a digital circuit unit is disclosed comprising an input terminal, a pull-up circuit, a fail-safe circuit, a signal processing circuit and an output terminal, wherein the fail-safe circuit comprises the features mentioned above.

These and various other advantages and features of novelty which characterize the present invention are pointed out with particularity in the claims annexed hereto and forming part hereof. However, for a better understanding of the invention, its advantages, and the object obtained by its use, reference should be made to the drawings which form a further part hereof, and to the accompanying descriptive matter in which preferred embodiments of the present invention are illustrated and described.

Figure 1:
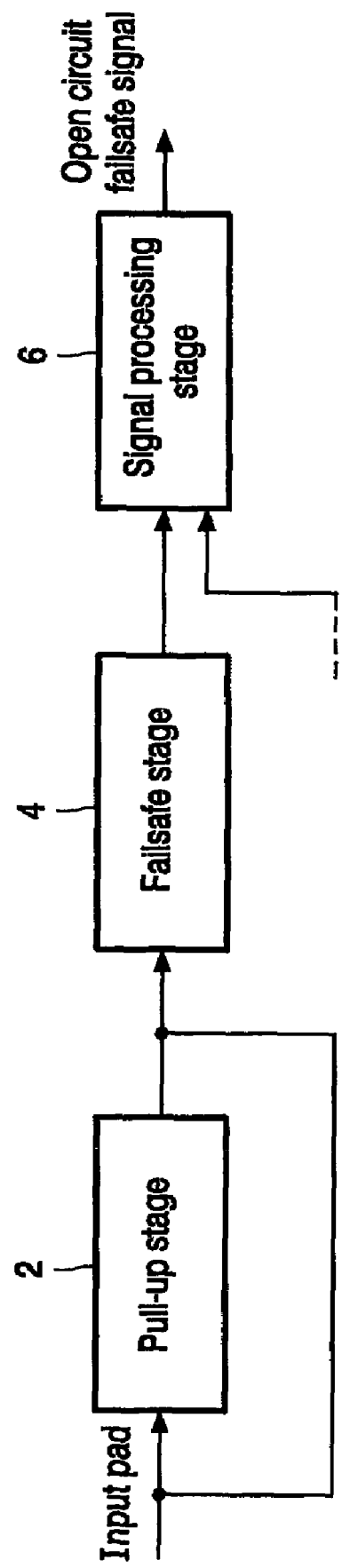
FIG. 1 shows a block diagram of the present invention.

FIG. 1 shows a block diagram of the present invention. The block diagram comprises an input pad connected to an input of a pull-up network 2 and to an input terminal of a fail-safe stage 4. The output of the pull-up network 2 is connected to the input of the fail-safe stage 4. The output of the fail-safe stage 4 is connected to an input terminal of a signal processing stage 6. Several other signals are supplied to the signal processing stage 6. The signal processing stage 6 provides an open-circuit fail-safe signal at its output.

If the input pad is not connected and thus floating, the voltage level is pulled to VCC by the pull-up network 2. The pull-up network 2 can be either a resistor or a transistor connected to VCC. The fail-safe stage 4 detects whether the input signal has a defined signal level and switches to VCC or to GND depending on the application in case there is not a defined signal level. The fail-safe stage 4 applies a defined signal level to the signal processing stage 6 if the input signal is floating. After this an open circuit situation is either or not detected, the output signal of the fail-safe stage 4 is processed in the signal processing stage 6 together with other output signals of fail-safe stages or internal signals.

Figure 2:
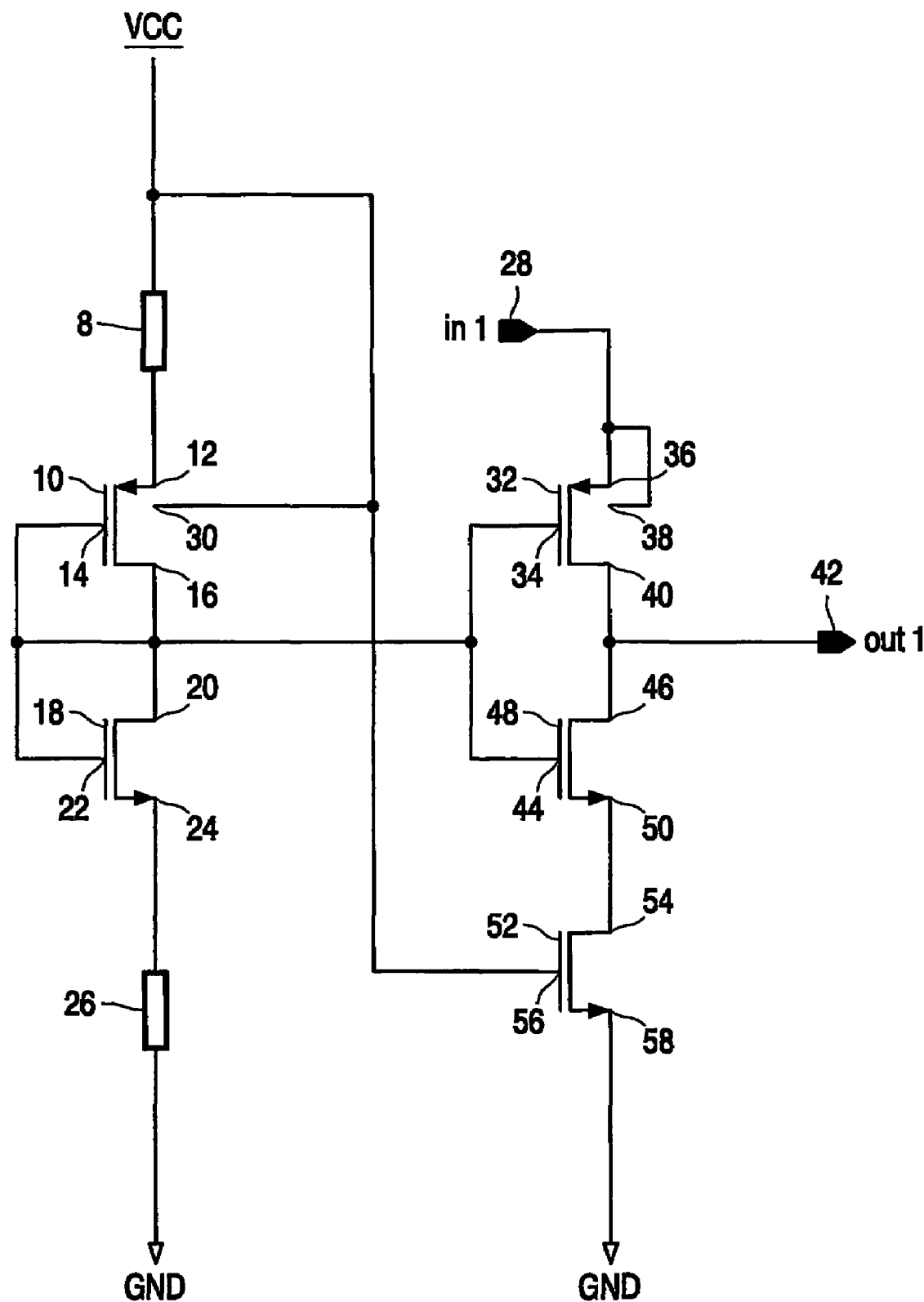
FIG. 2 shows a circuit diagram of the present invention, in which the switch level is close to VCC.

FIG. 2 shows a circuit diagram of the present invention. The shown circuit diagram has a switch level close to VCC. The circuit diagram comprises a resistor 8 connected on one side to VCC and on the other side to a source electrode 12 of a transistor 10. The transistor 10 is a p-MOSFET. A gate electrode 14 of transistor 10 is connected to a gate electrode 22 of transistor 18. The transistor 18 is an n-MOSFET transistor. A drain electrode 16 of transistor 10 is connected to a drain electrode 20 of transistor 18. A source electrode 24 of transistor 18 is connected to a resistor 26. The resistor 26 is connected on the other side to ground. The gate electrodes 14 and 22 are connected to the drain electrodes 16 and 20. The substrate terminal 30 of transistor 10 is connected to VCC. An input terminal 28 is connected to a source electrode 36 of a transistor 32. The transistor 32 is a p-MOSFET. A substrate terminal 38 of transistor 32 is connected to the input terminal 28. A gate electrode 34 of transistor 32 is connected to the drain electrodes 16 and 20 and to the gate electrodes 14 and 22. The gate electrode 34 is connected to a gate electrode 48 of a transistor 44. The transistor 44 is an n-MOSFET. A drain electrode 40 of transistor 32 is connected to an output terminal 42 and to a source electrode 46 of transistor 44. A source electrode 50 of transistor 44 is connected to a drain electrode 54 of transistor 52. The transistor 52 is an n-MOSFET. A gate electrode 56 of transistor 52 is connected to VCC. A source electrode 58 of transistor 52 is connected to ground.

The operation of the circuit of FIG. 2 is described in the following. Assume that the Nwell resistors 8 and 26 are shorted. The drains 16 and 20 and gates 14 and 22 of the transistors 10 and 18 are all connected to each other. This results in a stable situation wherein both the transistor 10 and the transistor 18 are open and the voltage of the drains 16 and 20 and the gates 14 and 22 remains at a constant level. This is defined as the "specific switch level" for this combination of the p-MOSFET 10 and the n-MOSFET 18 at this specific supply voltage ($V_{SP|VCC}$).

Transistor 32 and transistor 44 have the same dimensions as the transistors 10 and 18 have respectively. The gates 34 and 48 of the transistors 32 and 44 are also connected to the drains 16 and 20 and the gates 14 and 22, so that this switch level is also applied to the gates 34 and 48 of the transistors 32 and 44. However, at the source 36 of transistor 32 is not VCC but the input signal 'in1'.

Now, assume that drain and source of transistor 52 are shorted in the circuit. The specific switch level for transistor 32 and transistor 44 is named $V_{SP|IN1}$ and has exactly the same value as for the transistors 10 and 18 ($V_{SP|VCC}$). When 'in1' starts to rise, the specific switch level $V_{SP|IN1}$ increases for the combination of the transistor 32 and the transistor 44. Nevertheless, this level does not exceed $V_{SP|VCC}$, and thus the output 'out1' remains at a low voltage, because $V_{SP|VCC}$ can be considered a 'high' input voltage on the gates of transistor 32 and transistor 44.

When 'in1' finally reaches the same level as VCC, the $V_{SP|VCC}$ equals $V_{SP|in1}$. The voltage at the drains 16, 20 and gates 14, 22, 34, 48 can now be considered a 'low' input signal on the gates of transistor 32 and transistor 44 and, therefore, the output 42 switches from GND to VCC.

Now, the transistor 52 is included in the circuit. The gate 56 of transistor 52 is connected to VCC, resulting in an actuated n-MOSFET, that will work like a diode (i.e. in saturation a voltage of $V_{DS.transistor52}$ drops across this transistor 52 in combination with a constant current). This voltage drop is defined as $V_{SD.transistor52}$. This causes the $V_{SP|in}$ to decrease (defined as $V_{SP|in1}'$, resulting in condition $V_{SP|in1}' < V_{SP|in1}$ being achieved before in1 reaches VCC. The extra voltage drop between the gate 48 and source 50 of transistor 44 causes this decrease in switch level. The channel length of transistor 52 has an effect on the switch level. If the gate length of transistor 52 is increased, $V_{SD.transistor\ 52}$ will also increase, resulting in a higher $V_{GS.transistor\ 44}$ and thus lowering the switch level even more. For our application, the switch level was 0.3 Volt below VCC.

The resistors 8 and 26 are placed to reduce static current. The combination of transistor 10 and transistor 18 is conducting quite some current in this operation mode. These resistors can be tuned to the circuit to meet the product ICC specification. However, these resistors 8 and 26 may have some influence on the switch level and process-dependency of the switch level.

Figure 3:
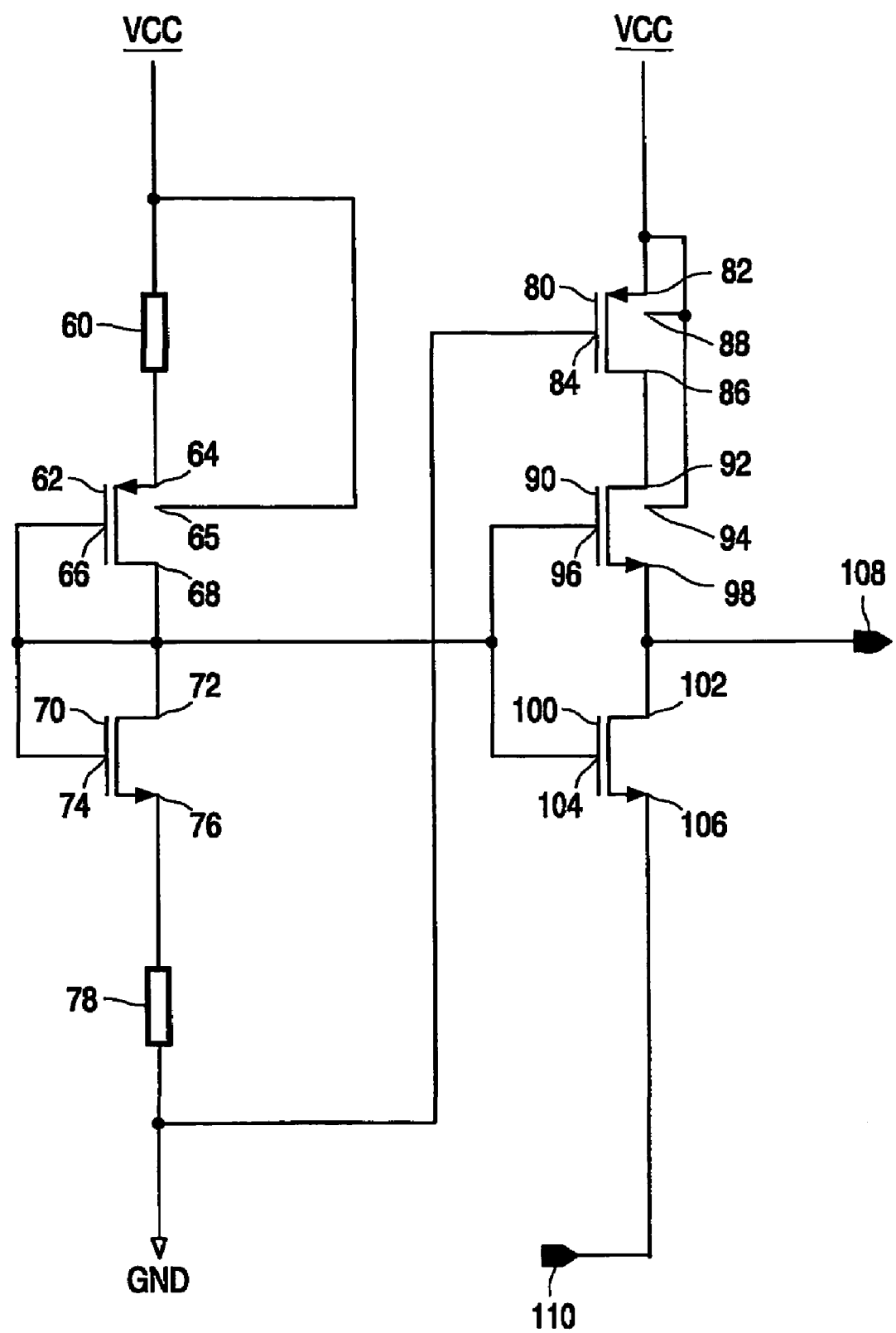
FIG. 3 shows a circuit diagram of the present invention, in which the switch level is close to GND.

FIG. 3 shows a circuit diagram of the present invention. The circuit shown has a switch level close to GND. The circuit comprises a resistor 60 connected on one side to VCC. The resistor 60 is connected on the other side to a source electrode 64 of a p-MOSFET transistor 62. A substrate terminal 65 of transistor 62 is connected to VCC. A gate electrode 66 of transistor 62 is connected to a gate electrode 74 of transistor 70. A drain electrode 68 of transistor 62 is connected to a drain electrode 72 of transistor 70 and to the gate electrode 66 and to the gate electrode 74. A source electrode 76 is connected to a resistor 78. The resistor 78 is connected on the other side to GND. A source electrode 82 of a p-MOSFET transistor 80 is connected to VCC. A substrate terminal 88 of transistor 80 is also connected to VCC. A gate electrode 84 of transistor 80 is connected to GND. A drain electrode 86 of transistor 80 is connected to a source electrode 92 of a p-MOSFET transistor 90. A substrate terminal 92 of transistor 90 is connected to VCC. A gate electrode 96 of transistor 90 is connected to the drain electrodes 68 and 72 and to the gate electrodes 66 and 74. The gate electrode 96 is also connected to a gate electrode 104 of a n-MOSFET transistor 100. A drain electrode 98 of transistor 90 is connected to an output terminal 108 and to a drain electrode 102 of transistor 100. A source electrode 106 is connected to an input terminal 110.

The operation of the circuit shown in FIG. 3 is analogous to the operation of FIG. 2. The circuit in FIG. 3 has a switch level close to GND. This circuit can be used in combination with a pull-down network.

The cells depicted in FIGS. 2 and 3 can detect whether the input signal lies close to one of the supply rails. Close to can be specified as a certain offset that is introduced by transistor 52 (FIG. 2) or transistor 80 (FIG. 3). It depends on the application whether the circuit of FIG. 2 or of FIG. 3 is used. For an application when there is an open circuit and the signal should be pulled close to VCC, the circuit of FIG. 2 applies for this case. For an application when there is an open circuit and the signal should be pulled close to GND, the circuit of FIG. 3 applies for this case. An advantageous feature of the present invention is that only five transistors are used for the fail-safe part.

Figure 4:
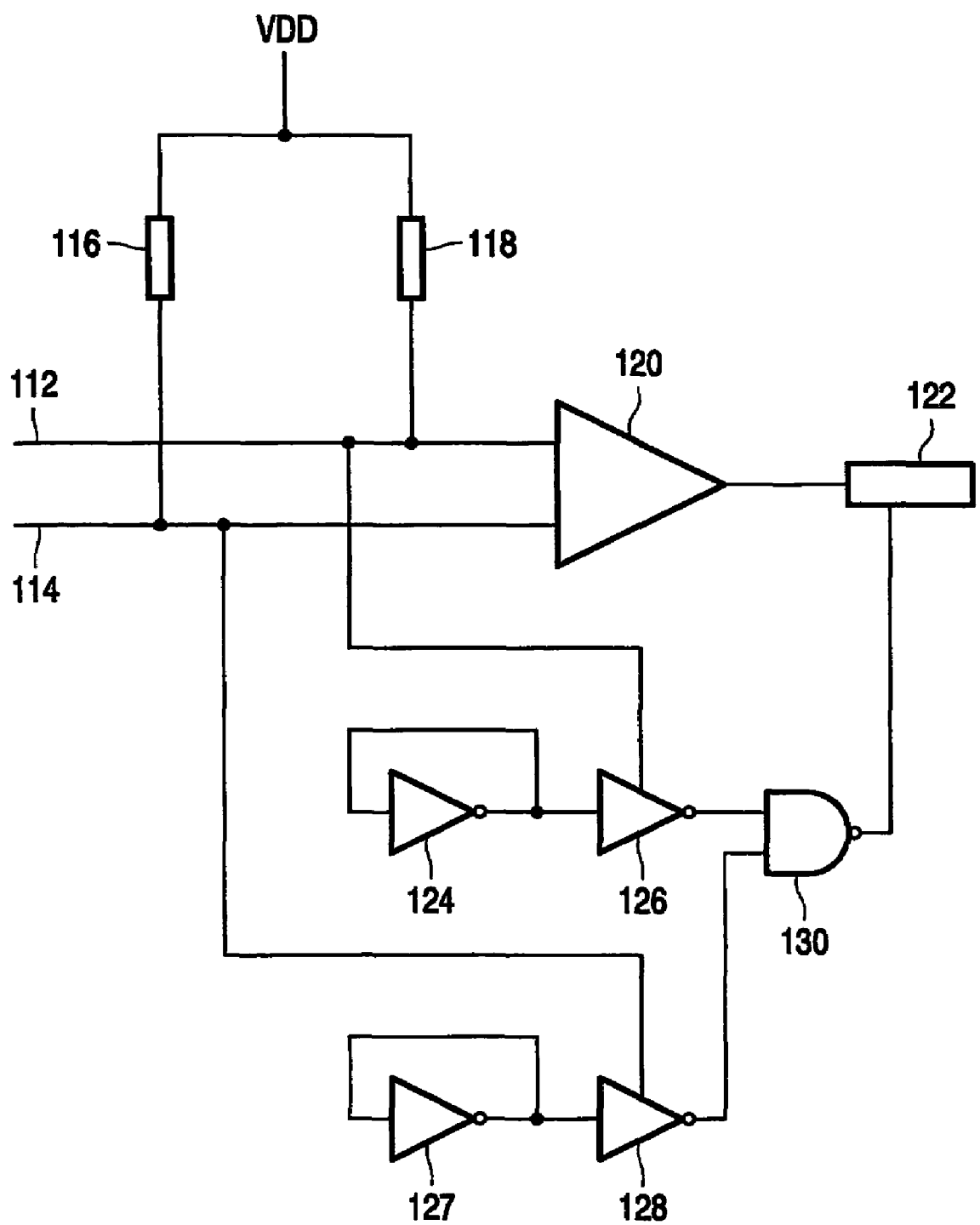
FIG. 4 shows a circuit diagram of an application of the present invention.

FIG. 4 shows an application of the present invention. FIG. 4 comprises a differential signal stage 120 connected to the input terminals 112 and 114. A resistor 116 is connected on one side to VDD and on the other side to the input terminal 114. A resistor 118 is connected on one side to VDD and on the other side to the input terminal 112. The input terminal 112 is connected to an inverter 126. An output terminal of inverter 126 is connected to an input terminal of a logic gate 130, for example a NAND gate. An input terminal of the inverter 126 is connected to an output terminal of an inverter 124. The output terminal of the inverter 124 is connected to an input terminal of the inverter 124. The two inverters 124 and 126 represent the circuit of FIG. 2 or FIG. 3. Inverter 124, represents, for example, the two transistors 10 and 18 of FIG. 2. Inverter 126 represents, for example, the transistors 32, 44 and 52. The connection of the input terminal of inverter 124 to the output terminal of the inverter 124 and to the input terminal of inverter 126 represents the connection between the drain electrodes 16 and 20 and the gate electrodes 14, 22, 34 and 48. The output terminal of inverter 126 represents the output terminal 42. The input terminal of inverter 126 connected to the input terminal 112 represents the input terminal 28 of FIG. 2. The input terminal 114 is connected to an inverter 128. The inverter 128 is connected to an inverter 127 in the same way as the inverter 126 is connected to the inverter 124. The inverters 127 and 128 represent in principle the same circuit as the inverters 124 and 126. The output terminal of the inverter 128 is also connected to a logic gate 130. The logic gate 130 combines the output signals of the inverter 126 and the inverter 128. The output of the logic gate 130 is connected to an output unit 122. The output terminal of the inverter 120 is also connected to the output unit 122. The output unit 122 combines the output signals of the inverter 120 and of the logic unit 130 and produces a common output signal.

The embodiment of FIG. 4 uses the present invention in combination with the pull-up resistors 116 and 118. If the resistors 116 and 118 are large enough, this will have no influence on the normal operation.

By using the source 36 of the p-MOSFET 32 of an inverter as an input terminal, it is no longer required to have an extremely small p-MOSFET-to-MOSFET ratio. A small imbalance in the stage suffices to arrive at a threshold level with an offset from VCC. The outputs of a first fail-safe stage comprising inverter 124 and inverter 126 and of a second fail-safe stage comprising the inverters 127 and 128 are connected to the input terminals of the logic gate 130 that combines the output signals and, if required, brings the output to the open fail-safe condition.

The present invention can be implemented for example in a high-speed differential line receiver that implements the electrical characteristics of Low Voltage Differential Signaling (LVDS). LVDS is used to achieve higher data rates on commonly used media LVDS overcomes the limitations of achievable slew rates and electromagnetic interference (EMI) restrictions of previous differential signaling techniques.

Figure 5:
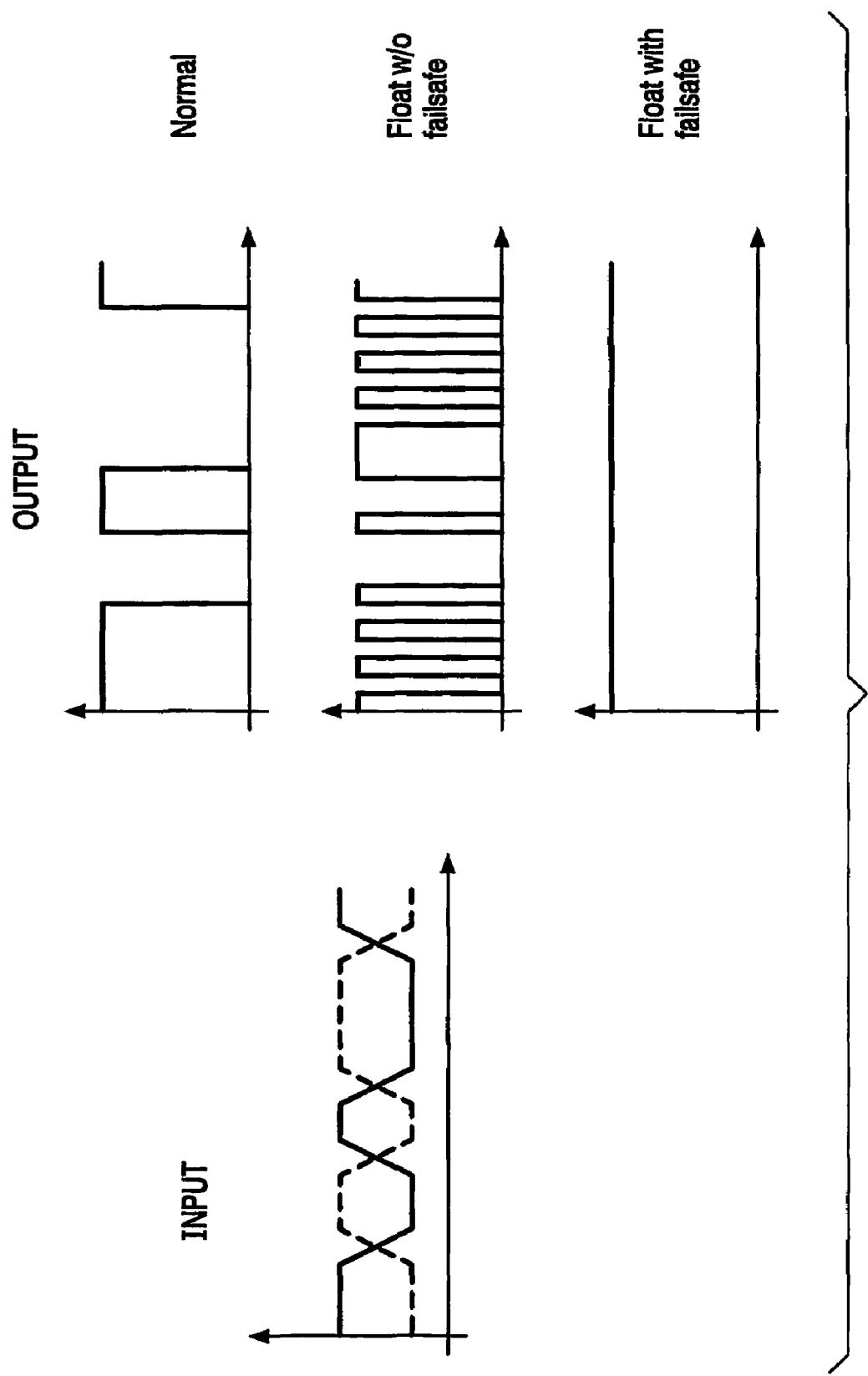
FIG. 5 shows an input signal and the corresponding output signals demonstrating the effect of the present invention.

FIG. 5 shows an input signal and the corresponding output signals for three different cases. The first case is the normal case. In the normal case every input pin has a defined input voltage. The output signal corresponds to the input signal.

The second case shows the output signal in case of a floating input value without a fail-safe stage of the present invention. The output signal shows an unexpected signal which is completely useless.

The last case shows an output signal, where at least one input signal is floating and the fail-safe stage of the present invention is used. The third case shows the example, where the signal is drawn to a high level leading to a useable output signal.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. A method for producing a fail-safe output signal in case of an open circuit condition of an input pad of a digital circuit unit, the method comprising:
   providing a constant switch level in a first inverter stage;
   providing a variable switch level in a second inverter stage that depends on a signal level of the input pad;
   comparing the constant switch level of the first inverter stage with the variable switch level of the second stage; and
   providing an output signal at an output terminal thereof if the switch level of the second stage is greater than the constant switch level; and
   decreasing the switch level of the second inverter stage by an additional circuit element connected in series with the second inverter,
   a defined output being produced irrespective of the open circuit condition of the input pad.

2. A fail-safe circuit for producing a fail-safe output signal in case of an open circuit condition of an input pad of a digital circuit unit, the fail-safe circuit comprising:
   a first inverter stage providing a constant switch level;
   a second inverter stage providing a variable switch level that depends on a signal level of the input pad and comparing the constant switch level of the first inverter stage with the variable switch level of the second stage and providing an output signal at an output terminal thereof if the variable switch level of the second stage is greater than the constant switch level; and
   an additional circuit element connected in series with the second inverter for decreasing the switch level of the second inverter stage;
   wherein the fail-safe circuit produces a defined output irrespective of the open circuit condition of the input pad.

3. The circuit of claim 2, wherein the first inverter stage includes at least two transistors each having a gate electrode and a drain electrode, and wherein the gate electrodes and the drain electrodes of the at least two transistors are connected to each other.

4. The circuit of claim 2, wherein the second inverter stage includes at least two transistors each having a gate electrode and a drain electrode, and wherein the gate electrodes of the at least two transistors are connected to each other and wherein the drain electrodes of the at least two transistors are connected to each other.

5. The circuit of claim 2, wherein gate electrodes of the second inverter stage are connected to gate electrodes of the first inverter stage.

6. The circuit of claim 2, wherein the input pad is connected to a source electrode of the second inverter stage.

7. The circuit of claim 2, wherein the output terminal is connected to a drain electrode of the second inverter stage.

8. The circuit of claim 2, wherein the additional circuit element is a transistor in saturated mode.

9. The circuit of claim 2, wherein the additional circuit element is a transistor in saturated mode, the transistor having a gate that is connected to VCC and a source that is connected to ground, the output signal being a high level signal.

10. The circuit of claim 2, wherein the additional circuit element is a transistor in saturated mode, the transistor having a gate that is connected to ground and a source that is connected to VCC, the output signal being a low level signal.

11. A digital circuit unit comprising an input terminal, a pull-up stage, a fail-safe stage for producing a fail-safe output signal in case of an open circuit condition of the input terminal, a signal processing stage and an output terminal, wherein the fail-safe stage comprises:
   a first inverter stage providing a constant switch level,
   a second inverter stage providing a variable switch level that depends on a signal level of the input terminal and comparing the constant switch level of the first inverter stage with the variable switch level of the second stage and providing an output signal at the output terminal if the variable switch level of the second stage is greater than the constant switch level, and
   an additional circuit element connected in series with the second inverter for decreasing the switch level of the second inverter stage;
   wherein the fail-safe circuit produces a defined output irrespective of the open circuit condition of the input terminal.

* * * * *